Nov. 24, 1970 W. MUNCH, JR 3,542,953

AMPLIFIERS POWERED FROM A SINGLE POWER SUPPLY AND DRIVEN CONTRAPHASALLY

Filed Aug. 29, 1967

INVENTOR
WALTER MUNCH, Jr.

William H. Benning, Agent
BY Hurvitz, Rose & Greene
ATTORNEYS

United States Patent Office 3,542,953

Patented Nov. 24, 1970

3,542,953
AMPLIFIERS POWERED FROM A SINGLE POWER SUPPLY AND DRIVEN CONTRAPHASALLY

Walter Munch, Jr., Park Hills, Covington, Ky., assignor to D. H. Baldwin Company, Cincinnati, Ohio, a corporation of Ohio Filed Aug. 29, 1967, Ser. No. 664,041
Int. Cl. H03f 3/42
U.S. Cl. 179—1 12 Claims

ABSTRACT OF THE DISCLOSURE

Two push-pull Class B audio amplifiers are driven in parallel but in opposite phases from a common signal source. The amplifiers drive separate loud speaker loads, which are driven in opposite phases by the amplifiers, so that acoustic radiation from the speakers is co-phasal. The amplifiers are of such character that they draw current from a common power supply only on alternate half cycles of the drive signals, so that peak current requirement is no greater for the amplifiers in parallel than for a single amplifier.

BACKGROUND OF THE INVENTION

The individual Class B audio amplifiers of the present system are per se old and well known, as in U.S. patents to Sharma No. 3,142,807 and Gohm No. 3,256,490. The purpose of the present invention is to produce twice as much audio power as is available from a given power supply driving a simple amplifier. The required power is made available by paralleling two amplifiers and driving these contraphasally, employing a single power supply for both amplifiers, whereby the amplifiers draw peak current from the power supply in alternation.

SUMMARY OF THE INVENTION

In Class B operation peak current I is drawn from an amplifier power supply when audio power peaks. If the same audio signal were derived from two amplifiers connected in parallel to a power supply, and co-phasally driven, the peak current drawn from the power supply would be 2I. Power supply current flows for only one half the audio cycle, for each amplifier of the type employed. Peak power supply current can be reduced by phase inverting the audio signal going to only one of the amplifiers. The amplifiers then draw peak power in alternation, instead of simultaneously. However, acoustic output should not be out of phase, where each amplifier drives a separate speaker. Therefore, one of the speaker coils is inverted, to render acoustic output co-phasal. The invention thus permits economical design of a power supply for a given audio output. The invention is applicable to any type of amplifier which draws power in a pulsating manner, and specifically is applied to amplifiers employing series transistors, the load being connected to the junction of the transistors. If the load does not consist of separate speakers, but consists of one load common to the amplifiers, the common load may be connected between the junction of the series-connected transistors in one amplifier and the junction of the series-connected transistors in the other amplifier.

DESCRIPTION OF THE PREFERRED EMBODIMENT

Figure 2:
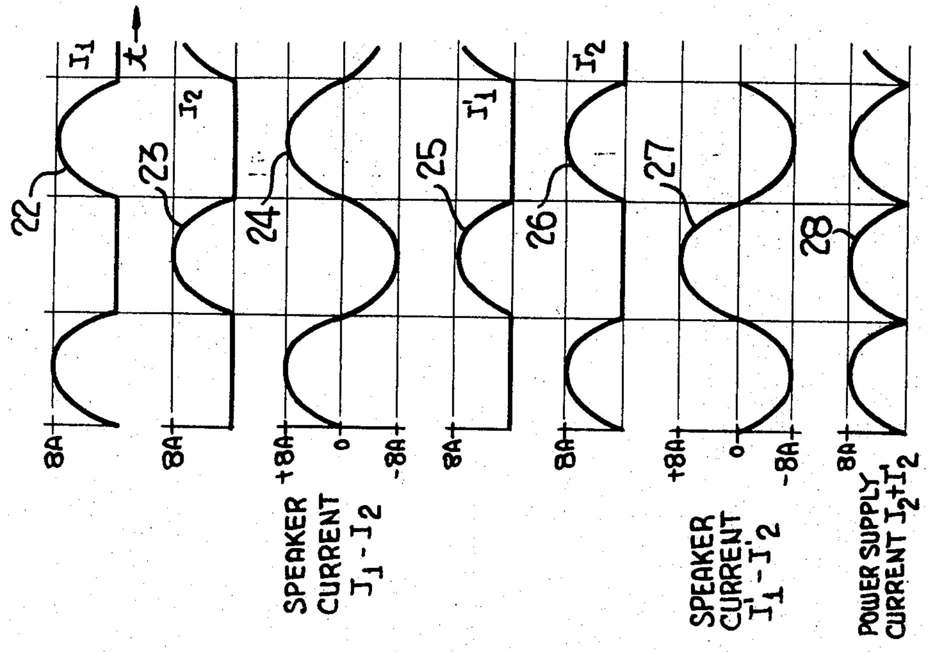
FIG. 2 is a plot of currents in the amplifier system, useful in explaining the invention.

An audio source 10 is coupled in one channel 11 directly, and in another channel 12 via a phase inverter 13 to separate driver amplifiers 14 and 15. Driver amplifier 15 drives the primary winding 16 of a transformer 17 having oppositely wound secondary windings 18 and 19. Windings 18 and 19 are connected between base and emitter electrodes of transistors $T_1$ and $T_2$, respectively. The amplifier is assumed operating Class B. The collector of $T_2$ is connected to the negative terminal of a DC power supply 20, while the collector of $T_1$ is connected directly to the emitter of $T_2$, the emitter of $T_1$ being grounded, as is one terminal of power supply 20. The latter supplies a negative voltage and the transistors are PNP. A series circuit then exists through the transistors $T_1$ and $T_2$.

To the collector of $T_1$ is connected one terminal of a capacitor $C_1$, the other terminal of which is connected to a loudspeaker load $LS_1$.

The driver 15 drives the primary 16' of a transformer 17', having secondaries 18' and 19', which drive transistors $T'_1$ and $T'_2$ in the Class B mode, precisely as $T_1$ and $T_2$ are driven, except for the phase inversion provided in channel 12 by phase inverter 13. This implies that when $T_1$ is driven conductive $T'_1$ is driven toward cut-off, and similarly for $T_2$ and $T'_2$.

In $T_2$ current flows in path $I_2$, while the transistor $T_1$ flow is in path $I_1$, through capacitor $C_1$, the transistors operating on opposite cycles of a sinusoidal drive signal assumed provided by audio source 10. Similarly $T'_1$ passes $I'_1$ and $T'_2$ passes $I'_2$, through capacitor $C_2$, to loudspeaker $LS_2$. The speakers are driven, therefore, with AC current, the currents being contraphasal. The coils of loudspeakers $LS_1$ and $LS_2$ are poled oppositely, as indicated by the dots adjacent thereto, so that speakers $LS_1$ and $LS_2$ radiate co-phasally.

For a more detailed description of the operation of Class B amplifiers of the type employed by applicant, reference is made to U.S. Pat. No. 3,142,807. The circuitry of that patent is suitable for use in the present system. Since operation is well understood, no detailed discussion is provided.

Figures 1, 3:
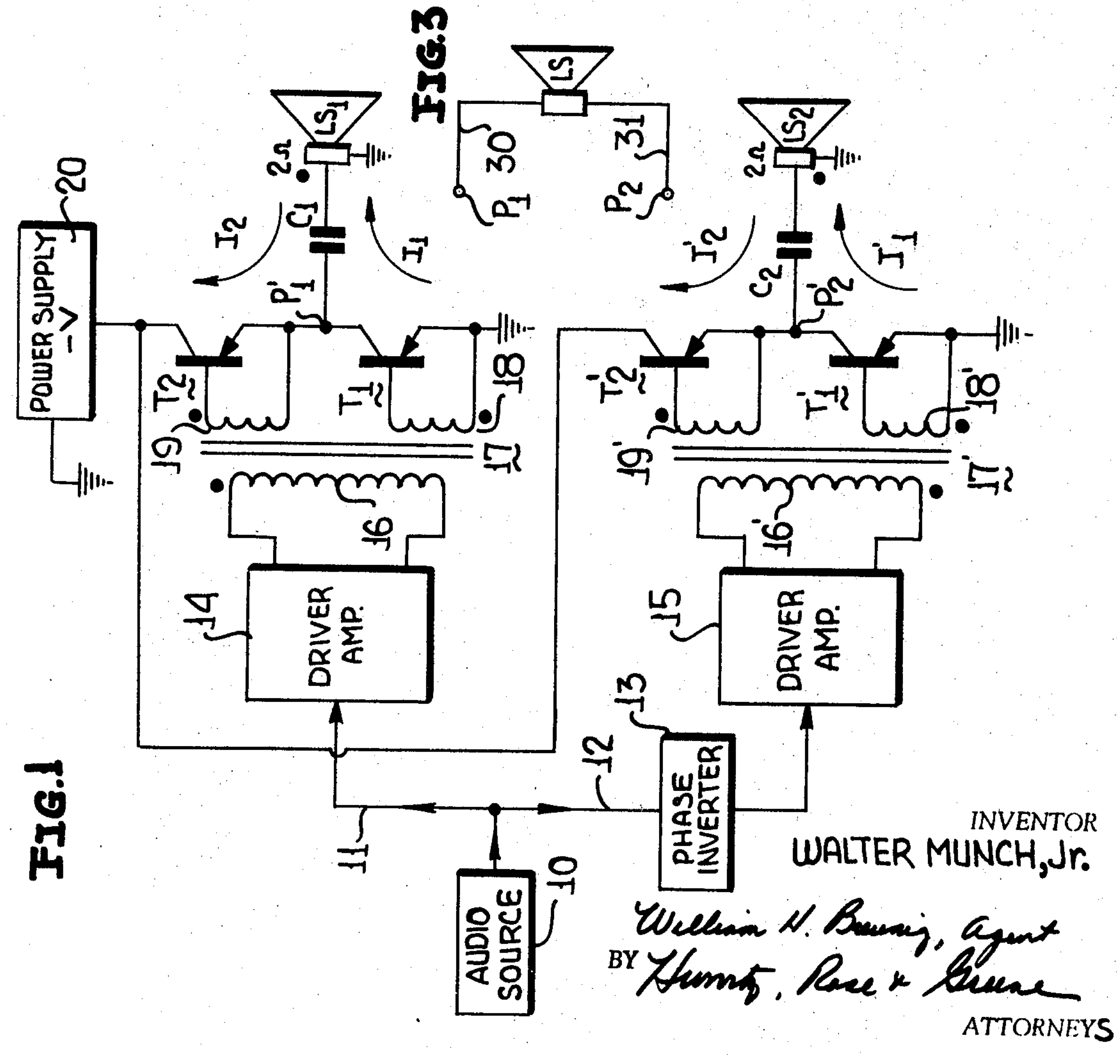
FIG. 1 of the drawings is a schematic circuit diagram of a system according to the invention.
FIG. 3 is a fragmentary circuit diagram indicating how a single loud speaker may be connected to the two amplifiers of the system of FIG. 2.

Referring to FIG. 2 of the accompanying drawings, plots of current are provided, which serve to clarify the operation of the system of FIG. 1.

A plot of $I_1$ and $I_2$ at 22, 23, respectively, in response to a sinusoidal drive current, indicates that each is zero while the other is positive, since only one of the transistors is in conduction at any one time. The power supply need only provide $I_2$ and $I'_2$. The amplitude of the sum of these never exceeds the amplitude of one of these, because while one is being supplied the other is not. Therefore peak current drawn on the power supply, in driving both Class B amplifiers, is no greater than would be the case if only one were present.

Speaker current $I_1—I_2$, at line 24 of FIG. 2 is an AC current, whereas the power supply drain is unidirectional. $I'_1$ and $I'_2$ are illustrated at lines 25 and 26, and $I'_2$ is being supplied only while $I_2$ is not required, and similarly for $I'_1$ and $I_1$. The current in loudspeaker $LS_2$ is $I'_1—I'_2$, at plot 27. Total power supply current is shown at plot 28, which represents $I_2+I'_2$.

Referring to FIG. 3, if the load to be driven by the amplifiers arranged according to this invention is a single one—for example, a loudspeaker LS—its leads 30, 31 may be connected via points $P_1$ and $P_2$ to corresponding junctions $P'_1$ and $P'_2$ of FIG. 1, which have the same DC level, so that no DC will flow through the load LS. Since the respective signals at points $P'_1$ and $P'_2$ of FIG. 1 are 180° out of phase, they will combine to drive the load LS.

Should the amplifiers be driven Class A or Class AB, the advantages of the invention would be retained. Peak power supply capacity would be required to be less than that required for two amplifiers, not arranged according to the invention.

What I claim is:

1. An amplifier system, including
a power supply,
a first amplifier capable of transferring a total input waveform as a corresponding output waveform to a load,
a second amplifier capable of transferring a total input waveform as a corresponding output waveform to a load,
means connecting said power supply in supply relation to said first and second amplifiers simultaneously,
said amplifiers being each of the type which draws current from said power supply at least preponderantly in the same sense in response to a common drive signal,
a source of said drive signal,
means responsive to said drive signal for driving said first amplifier and said second amplifier to have contra-phasal output waveforms, whereby said amplifiers draw current from said power supply at least preponderantly in alternation.

2. The combination according to claim 1 wherein each of said amplifiers includes two series-connected transistors connected in series between said power supply and a reference point, and
load means connected to the junctions of the series-connected transistors of each of said amplifiers.

3. The combination according to claim 2 wherein said load means is two separate loudspeakers, each of said loudspeakers having a drive coil, and means connecting said drive coils to said amplifiers arranged to provide co-phasal acoustic radiation from said loudspeakers in response to said drive signal.

4. The combination according to claim 2 wherein said load means is a single loudspeaker.

5. The combination according to claim 1 wherein said amplifiers are Class B amplifiers arranged to draw substantially zero current from said power supply in response to half cycles of one polarity of said drive signal, and maximum current in response to peaks of half cycles of alternate polarity of said drive signal.

6. The combination according to claim 2 wherein said amplifiers are Class B amplifiers.

7. The combination according to claim 3 wherein said amplifiers are Class B amplifiers.

8. The combination according to claim 4 wherein said amplifiers are Class B amplifiers.

9. An amplifier system, including
a power supply,
a first amplifier capable of transferring a total input waveform to a load,
a second amplifier capable of transferring a total input waveform to a load,
means connecting said power supply in parallel supply relation to both said amplifiers, and
means driving said amplifiers so that said amplifiers draw preponderant currents from said power supply in alternation in response to a common drive signal, whereby the peak current drain from said power supply is that of only one of said amplifiers.

10. The combination according to claim 9 wherein each of said amplifiers is a Class B amplifier.

11. The combination according to claim 9 wherein is provided
separate electro-acoustic load means separately coupled to said amplifiers, and
means phasing said separate electro-acoustic load means to provide co-phasal acoustic energy in response to said drive signal.

12. The combination according to claim 9 wherein is provided
a single electro-acoustic load means connected to said amplifiers.

References Cited

UNITED STATES PATENTS

| | | | |
|---|---|---|---|
| 2,762,870 | 9/1956 | Sziklai | 179—1 |
| 3,142,807 | 7/1964 | Sharma | 330—15 |

OTHER REFERENCES

Angelo: Electronic Circuits, 1964, p. 304, Fig. 11–18b.

KATHLEEN H. CLAFFY, Primary Examiner

D. W. OLMS, Assistant Examiner

U.S. Cl. X.R.

330—15, 40